(12) United States Patent
Weber et al.

(10) Patent No.: US 6,486,681 B1
(45) Date of Patent: Nov. 26, 2002

(54) MEASURING CIRCUIT FOR A CAPACITIVE SENSOR FOR DISTANCE MEASUREMENT AND/OR SPACE MONITORING

(75) Inventors: Jens Weber, Kelkheim-Fischbach (DE); Juergen Hoetzel, Florstadt (DE); Wolf-Henning Rech, Leonberg (DE); Ega Tschiskale, Hoppetenzell (DE)

(73) Assignee: Robert Bosch GmbH, Stuttgart (DE)

(*) Notice: Subject to any disclaimer, the term of this patent is extended or adjusted under 35 U.S.C. 154(b) by 0 days.

(21) Appl. No.: 09/762,461
(22) PCT Filed: Jun. 17, 1999
(86) PCT No.: PCT/DE99/01780
§ 371 (c)(1),
(2), (4) Date: Mar. 22, 2001
(87) PCT Pub. No.: WO00/10250
PCT Pub. Date: Feb. 24, 2000

(30) Foreign Application Priority Data

Aug. 10, 1998 (DE) .......................... 198 36 054

(51) Int. Cl.⁷ .................. G01R 27/26; G01R 27/08
(52) U.S. Cl. .................. 324/662; 324/671; 324/688
(58) Field of Search ................ 324/662, 663, 324/687, 688, 686, 671

(56) References Cited

U.S. PATENT DOCUMENTS

| | | | |
|---|---|---|---|
| 5,546,005 A | * 8/1996 | Rauchwerger | 324/664 |
| 5,757,196 A | 5/1998 | Wetzel | |
| 5,872,507 A | 2/1999 | Weber et al. | |
| 5,936,412 A | * 8/1999 | Gershenfeld et al. | 324/663 |

FOREIGN PATENT DOCUMENTS

| | | |
|---|---|---|
| DE | 2 044 790 | 3/1972 |
| DE | 195 01 642 A1 | 7/1996 |
| WO | 89/08352 | 9/1989 |

* cited by examiner

Primary Examiner—N. Le
Assistant Examiner—J Kerveros
(74) Attorney, Agent, or Firm—Michael J. Striker

(57) ABSTRACT

In a measuring circuit for a capacitive sensor for distance measurement and/or space monitoring comprising sensor wire and shielding electrode, a sine signal is applied to the shielding electrode. The sensor wire is connected, via a shielded cable, with one input of an input amplifier which serves as current-voltage converter and whose supply voltage is likewise influenced by the sine signal. The output of the input amplifier is connected with one input of a phase-dependent rectifier arrangement, the sine signal is applied to the other input of the phase-dependent rectifier arrangement, and its output is connected to an analog-to-digital converter.

6 Claims, 1 Drawing Sheet

MEASURING CIRCUIT FOR A CAPACITIVE SENSOR FOR DISTANCE MEASUREMENT AND/OR SPACE MONITORING

BACKGROUND OF THE INVENTION

The invention is directed to a measuring circuit for a capacitive sensor for distance measurement and/or space monitoring comprising a sensor wire and a shielding electrode.

In recent times, capacitive sensors have repeatedly proven themselves successful in space monitoring and also in measuring distances from obstacles, for example, in the vicinity of motor vehicles. A method known from DE 195 01 642 A1 for contactless distance measurement which is used as a parking aid employs ultrasonic sensors and also a capacitive sensor, although its measuring circuit is often insufficient for stricter requirements respecting accuracy.

Therefore, it is the object of the present invention to provide a measuring circuit of the type mentioned above, by means of which it is possible to measure input current and capacitance sensitively and with high resolution.

SUMMARY OF THE INVENTION

According to the invention, this object is met in that a sine signal is applied to the shielding electrode, in that the sensor wire is connected, via a shielded cable, with one input of an input amplifier which serves as current-voltage converter and whose supply voltage is likewise influenced by the sine signal, in that the output of the input amplifier is connected with one input of a phase-dependent rectifier arrangement, the sine signal is applied to the other input of the phase-dependent rectifier arrangement and its output is connected to an analog-to-digital converter.

The measuring circuit according to the invention has the advantage that it requires few structural component parts, is not susceptible to temperatures, has an extremely low input capacitance (less than 10 fF) and has a measuring speed of less than 100 µs. A further advantage consists in that this measuring circuit is appropriate for motor vehicles because it does not cause interference particularly in the long wave range of car radios.

An advantageous construction of the measuring circuit according to the invention consists in that the input amplifier is a negative feedback differential amplifier for a capacitively induced differential current whose inverting input is connected with the sensor wire and whose noninverting input is connected to a voltage divider which is connected between a constant voltage source and the sine signal source, wherein the resistor of the voltage divider connected with the sine signal source is connected in parallel with a capacitor.

Because of the negative feedback and the resulting low input resistance, the input capacitances and coupling capacitances hardly impair sensitivity. Further, the negative feedback reduces the effective input capacitance by the amount of the no-load voltage gain of the amplifier. Accordingly, changes in capacitance in the environment which are several orders of magnitude below the input capacitance of the circuit can be reliably detected.

In this respect, it has proven particularly successful when the differential amplifier is an operational amplifier whose supply voltage is stabilized by a voltage regulator relative to the voltage of the shielding electrode. This prevents its limited suppression of signals on the supply voltage from simulating an input signal. Accordingly, full sensitivity can be utilized.

In order to prevent disturbances it has proven advantageous when the shielding electrode of the sensor is connected with the sine signal source via the shielding of the shielded cable. Accordingly, only very little distortion occurs, so that the EMC requirements can be met.

In a particularly advantageous construction of the invention, it is suggested that a subtraction stage is provided between the input amplifier and the phase-dependent rectifier arrangement, wherein the positive input of the subtraction stage is connected with the output of the input amplifier and the sine signal is applied to the negative input of the subtraction stage. The constant signal component originating from the modulated supply voltage is removed from the output of the input amplifier by the subtraction stage.

In another advantageous construction of the invention, it is proposed that a filter is provided at the output of the subtraction stage, which filter is used as a preliminary filter for the subsequent stage, that is, for the phase-dependent rectifier arrangement.

BRIEF DESCRIPTION OF THE DRAWINGS

Embodiment examples of the invention are shown in the drawing in several Figures and are explained more fully in the following.

DETAILED DESCRIPTION OF THE PREFERRED EMBODIMENTS

Identical parts are provided with the same reference numbers in the Figures.

Figure 1:
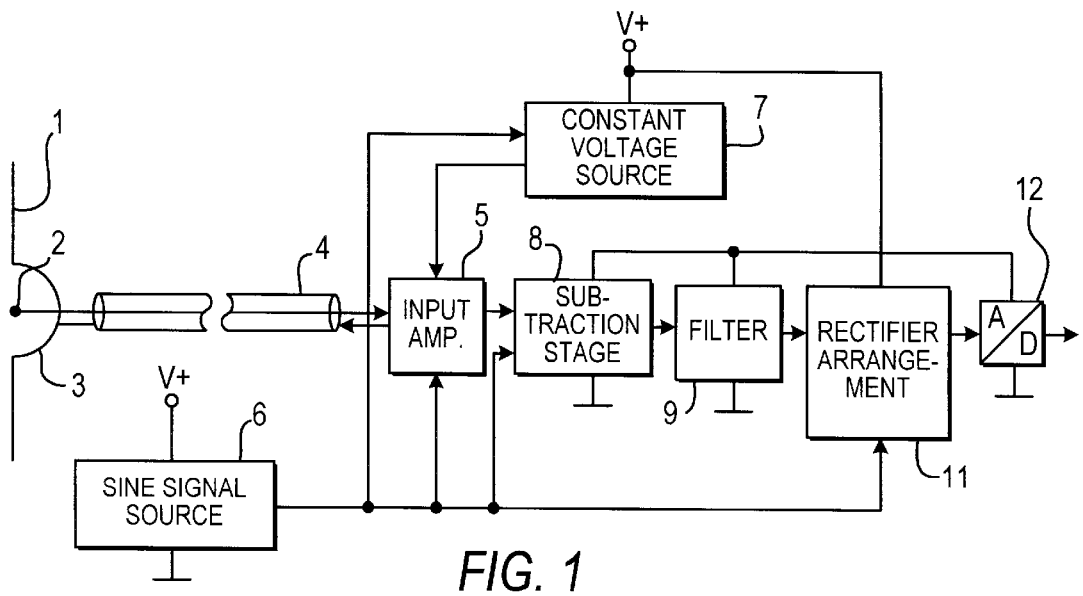
FIG. 1 shows a block diagram of a measuring circuit according to the invention.
Figure 2:
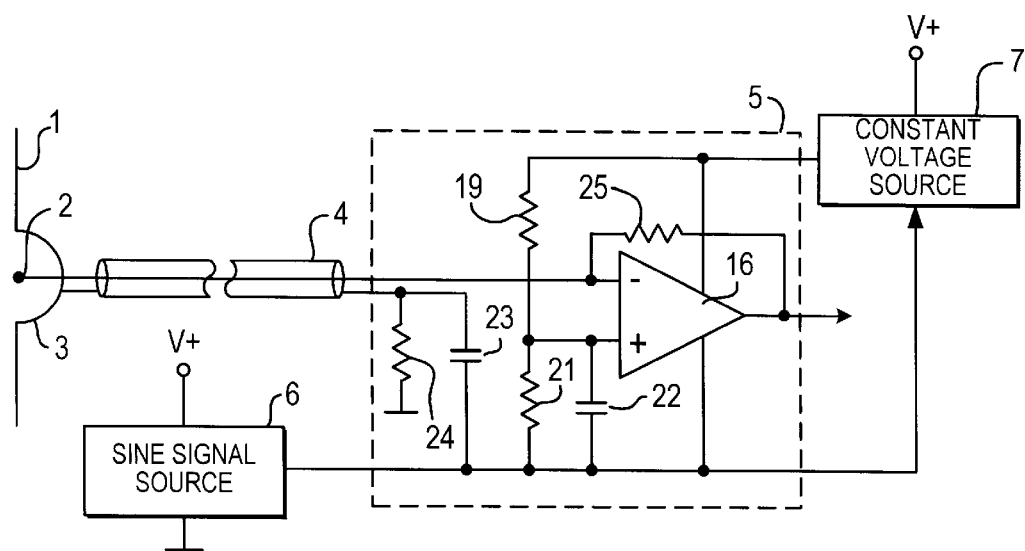
FIG. 2 shows a construction of an input amplifier of the measuring circuit.

FIG. 1 shows a capacitive sensor 1 comprising a sensor wire 2 and a shielding electrode 3 which are connected with the measuring circuit according to the invention by the inner conductor and the shielding of a cable 4. The inner conductor of the cable 4 is connected directly to an input of an input amplifier 5; a sine signal generated by a sine signal source 6 (with DC voltage offset) is applied to the other input of the input amplifier 5 and is additionally supplied to the shield of the cable 4. Further, the input amplifier 5 is fed by a constant voltage source 7, to which the sine signal is likewise fed, with a supply voltage which is correspondingly modified in this way. This makes possible an extremely low input capacitance in the femtofarad range. The input amplifier 5 which is used for current-voltage conversion and which is described in more detail with reference to FIG. 2 gives a measurement signal at its output which is generated corresponding to the size or change in capacitance, wherein, in accordance with the concept, only the signal component going beyond the sine signal component is to be associated with the measured capacitance of the sensor 1.

This measurement signal is then fed to an input of a subtraction stage 8, the sine signal likewise being applied to the other input of the subtraction stage 8. In this way, the constant signal component originating from the modulated supply voltage is removed at the output of the input amplifier 5.

The output signal of the subtraction stage 8 is possibly fed to a filter 9 for prefiltration of a phase-dependent rectifier arrangement 11 to which the sine signal is also applied. The sine signal is initially matched in phase with the measurement signal and is then further processed with the measurement signal in such a way that a corresponding direct voltage signal can be taken off at the output of the phase-dependent rectifier arrangement 11.

A temperature-dependent frequency drift of the sine signal source 6 which always affects the measurement signal can be reduced, per se, only through elaborate and accordingly costly circuits. The problems with fixed frequency filters are avoided with the phase-dependent rectifier arrangement 11 used here because the drifting sine frequency is used as reference signal. Accordingly, simple and therefore inexpensive sine oscillators can be used. Since the phase-dependent rectification works at the same time as a very narrow-band filter, an excellent interference signal suppression is achieved.

The signal given by the phase dependent rectifier arrangement is then fed to an analog-to-digital converter 12 with interface, whose output signal can finally be directed via the interface to a control device with a microprocessor or to other evaluating electronics.

The input amplifier 5 shown in FIG. 2 works as a differential amplifier for a capacitively induced differential current between its two input electrodes. A commercially available operational amplifier 16 is advantageously used for this differential amplifier. The sensor wire 2 is connected to the inverting input 17 of the operational amplifier 16, while the noninverting input 18 is connected with a voltage divider 19, 21 arranged between the constant voltage source 7 and the output of the sine signal source 6, wherein a capacitor 22 is connected in parallel with the resistor 21. The shielding electrode 3 is connected with the output of the sine signal source 6 via a capacitor 23 and to ground via a resistor 24.

Further, the operational amplifier 16 is negatively coupled by means of a resistor 25 arranged between the output and inverting input 17, so that the input resistance of the amplifier is reduced in a known manner and the sensitivity is hardly impaired by the input capacitances. The supply voltage supplied by the constant voltage source 7 for the operational amplifier 16 is stabilized relative to the shielding electrode 3 by supplying the sine signal to the source 7. Accordingly, the full sensitivity of the measuring circuit is available. The signal which can be taken off at the output of the operational amplifier 16 is supplied either via the subtraction stage 8 and the filter 9 or directly to the phase-dependent rectifier arrangement 11, as is described in connection with FIG. 1.

What is claimed is:

1. Measuring circuit for a capacitive sensor (1) for distance measurement and/or space monitoring comprising sensor wire (2) and shielding electrode (3), characterized in that a sine signal is applied to the shielding electrode (3), in that the sensor wire (2) is connected, via a shielded cable (4), with one input of an input amplifier (5) which serves as current-voltage converter and whose supply voltage is likewise influenced by the sine signal, in that the output of the input amplifier (5) is connected with one input of a phase-dependent rectifier arrangement (11), the sine signal is applied to the other input of the phase-dependent rectifier arrangement (11) and its output is connected to an analog-to-digital converter (12).

2. Measuring circuit according to claim 1, characterized in that the input amplifier (5) is a negative feedback differential amplifier for a capacitively induced differential current whose inverting input (17) is connected with the sensor wire (2) and whose noninverting input (18) is connected to a voltage divider (19, 21) which is connected between a constant voltage source (7) and the sine signal source (6), wherein the resistor (21) of the voltage divider connected with the sine signal source (6) is connected in parallel with a capacitor (22).

3. Measuring circuit according to claim 2, characterized in that the differential amplifier is an operational amplifier (16) whose supply voltage is stabilized by a voltage regulator relative to the voltage of the shielding electrode.

4. Measuring circuit according to claim 2, characterized in that the shielding electrode (3) of the sensor (1) is connected with the sine signal source (6) via the shielding of the shielded cable (4).

5. Measuring circuit according to claim 1, characterized in that a subtraction stage (8) is provided between the input amplifier (5) and the phase-dependent rectifier arrangement (11), wherein the positive input of the subtraction stage (8) is connected with the output of the input amplifier (5) and the sine signal is applied to the negative input of the subtraction stage (8).

6. Measuring circuit according to claim 5, characterized in that a filter (9) is provided at the output of the subtraction stage (8).

* * * * *